United States Patent
Winograd et al.

(10) Patent No.: US 7,350,126 B2
(45) Date of Patent: Mar. 25, 2008

(54) METHOD FOR CONSTRUCTING ERASURE CORRECTING CODES WHOSE IMPLEMENTATION REQUIRES ONLY EXCLUSIVE ORS

(75) Inventors: Shmuel Winograd, Scarsdale, NY (US); Barry Marshall Trager, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 641 days.

(21) Appl. No.: 10/600,593

(22) Filed: Jun. 23, 2003

(65) Prior Publication Data

US 2004/0260994 A1    Dec. 23, 2004

(51) Int. Cl.
*H03M 13/00* (2006.01)
(52) U.S. Cl. .................................... 714/752
(58) Field of Classification Search ................. 714/771
See application file for complete search history.

(56) References Cited

U.S. PATENT DOCUMENTS

| 5,271,012 A | 12/1993 | Blaum et al. |
| 5,333,143 A | 7/1994 | Blaum et al. |
| 5,579,475 A | 11/1996 | Blaum et al. |
| 6,148,430 A * | 11/2000 | Weng .......................... 714/770 |
| 6,643,822 B1 * | 11/2003 | Murthy ........................ 714/805 |
| 6,694,479 B1 * | 2/2004 | Murthy et al. ............... 714/805 |
| 6,748,488 B2 * | 6/2004 | Byrd et al. .................. 711/114 |
| 6,792,391 B1 * | 9/2004 | Nanda ......................... 702/185 |
| 6,823,425 B2 * | 11/2004 | Ghosh et al. ................ 711/114 |
| 2003/0126522 A1 * | 7/2003 | English et al. .............. 714/718 |

OTHER PUBLICATIONS

James S. Plank; A Tutorial ofn Reed-Solomon Coding for Fault-Tolerance in RAID-like Systems; Department of Computer Science, University of Tennessee, Feb. 19, 1999; pp. 1-19.

* cited by examiner

*Primary Examiner*—Albert Decady
*Assistant Examiner*—Sam Rizk
(74) *Attorney, Agent, or Firm*—Whitham, Curtis, Christofferson & Cook, PC; Stephen C. Kaufman

(57) ABSTRACT

Error correcting codes of any distance (including codes of distance greater than four) use only exclusive OR (XOR) operations. Any code over a finite field of characteristic two are converted into a code whose encoding and correcting algorithms involve only XORs of words (and loading and storing of the data). Thus, the implementation of the encoding and correcting algorithms is more efficient, since it uses only XORs of words—an operation which is available on almost all microprocessors. An important code, the (3, 3) code of distance four, is also described.

12 Claims, 4 Drawing Sheets

METHOD FOR CONSTRUCTING ERASURE CORRECTING CODES WHOSE IMPLEMENTATION REQUIRES ONLY EXCLUSIVE ORS

BACKGROUND OF THE INVENTION

1. Field of the Invention

The present invention generally relates to codes for correcting erasure errors and, more particularly, to constructing codes for which the encoding and correcting algorithms can be executed fast or "on-the-fly". The invention has particular application in reading data from arrays of hard disks in data processing systems.

2. Background Description

In some applications, for example in RAID (Redundant Array of Inexpensive (or Independent) Disks) systems, it is necessary to construct codes for correcting erasure errors; i.e., errors whose location is known. It is also desirable that both the encoding and the correcting algorithms be executed fast. The usual encoding and correcting algorithms operate on bytes (or as many bits as the dimension of the field), and thus require the breaking of the stream of data into small chunks plus special circuitry to perform the field operations. This is time consuming when done on a general purpose microprocessor, and therefore specially designed chips, such as ASICs (Application Specific Integrated Circuits), are used for the execution of these algorithms.

Storage systems have relied on simple erasure codes (e.g., parity, mirroring, etc.) to protect against data loss. However, disk drive reliability has not increased as fast as the drive capacity has increased, creating significant vulnerabilities for simple codes. The industry-wide shift to SATA (Serial Advanced Technology Attachment) based hard disk drives (HDDs) will make this more of an issue. Therefore, significantly stronger erasure codes are going to be required for storage systems.

It is known that Reed-Solomon (RS) coding is used in RAID systems. See, for example, the article by James S. Plank entitled "A tutorial on Reed-Solomon Coding for Fault-Tolerance in RAID-like Systems", *Software-Practice and Experience*, Vol. 27(9), September 1997, pp. 995–1012. The author describes a three data, three check arrangement as an example of how to produce RS encoding and decoding. He shows how to generate the appropriate Vandermonde matrix, how to use it to generate three checks, and then how to use it to decode from three devices. However, the author states on page 1008: "To the author's knowledge, there is no parity-based scheme that tolerates three or more device failures with minimal device overhead."

It is highly desirable to have the encoding process be as efficient as possible, both in terms of operation per data byte transferred and required memory operations. Ideal solutions would rely only on exclusive OR (XOR) operations, with no branching. The EVENODD code is one such code, but it has some significant limitations. First, there are known solutions only up to distance four. Second, the size of a data set on a drive must be a multiple of a prime number minus one, and the number of data drives must also be less the prime number. The result is a rather inflexible code, and usually requires operating a rather large data set, since 3, 5 and 17 are the only small primes where the prime equals $2^n+1$, allowing standard length data sectors. The data operations are performed by mixing data words from (prime minus one) locations on each data drive, necessitating a large register set or many memory operations.

U.S. Pat. No. 5,271,012 to Blaum et al. discloses a method for encoding and rebuilding the data contents of up to two unavailable direct access storage devices (DASDs) in a DASD array. This method uses an example of the EVENODD code described above. Also relevant are U.S. Pat. No. 5,33,143 and No. 5,579,475, both to Blaum et al., which disclose similar methods for coding and rebuilding data from up to two unavailable DASDs in a DASD array.

SUMMARY OF THE INVENTION

It is therefore an object of the present invention to provide a general solution to providing erasure correcting codes for distances greater than two using only XOR operations.

According to the invention, any code over a finite field of characteristic two can be converted into a code whose encoding and correcting algorithms involve only XORs of words (and loading and storing of the data). Thus, the implementation of the encoding and correcting algorithms is more efficient, since it uses only XORs of words—an operation which is available on almost all microprocessors.

The preferred embodiment of the invention is a computer implemented method for correcting four or more erasure errors whose locations are known. The method first converts a code over a finite field of characteristic two into a code whose encoding and correcting algorithms involve only exclusive OR (XOR) operations of words. Data is read from main volatile memory and encoded using only XOR operations to generate a correcting code. The data and correcting code are then stored in an auxiliary array of non-volatile storage devices. Data and correcting code are read from the auxiliary array of non-volatile storage devices. Erasure errors in the data read from the auxiliary array of non-volatile storage devices are detected and, using only XOR operations, generate reconstructed data is generated.

According to one aspect of the invention, there is provided an encoding and correcting method which can be performed using only XOR operations on words for error correcting codes with four or more check symbols which can correct as many errors as there are check symbols. According to another aspect of the invention, there is provided an encoding and correcting method which can be obtained by transforming encoding and decoding matrices over $GF(2^n)$, the Galois Field of $2^n$ elements for n greater than one. This method can be performed using only XOR operations on words. According to a third aspect of the invention, there is provided a code whose encoding a decoding involve only XOR operations of words that is specific to (3, 3) code of distance 4.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
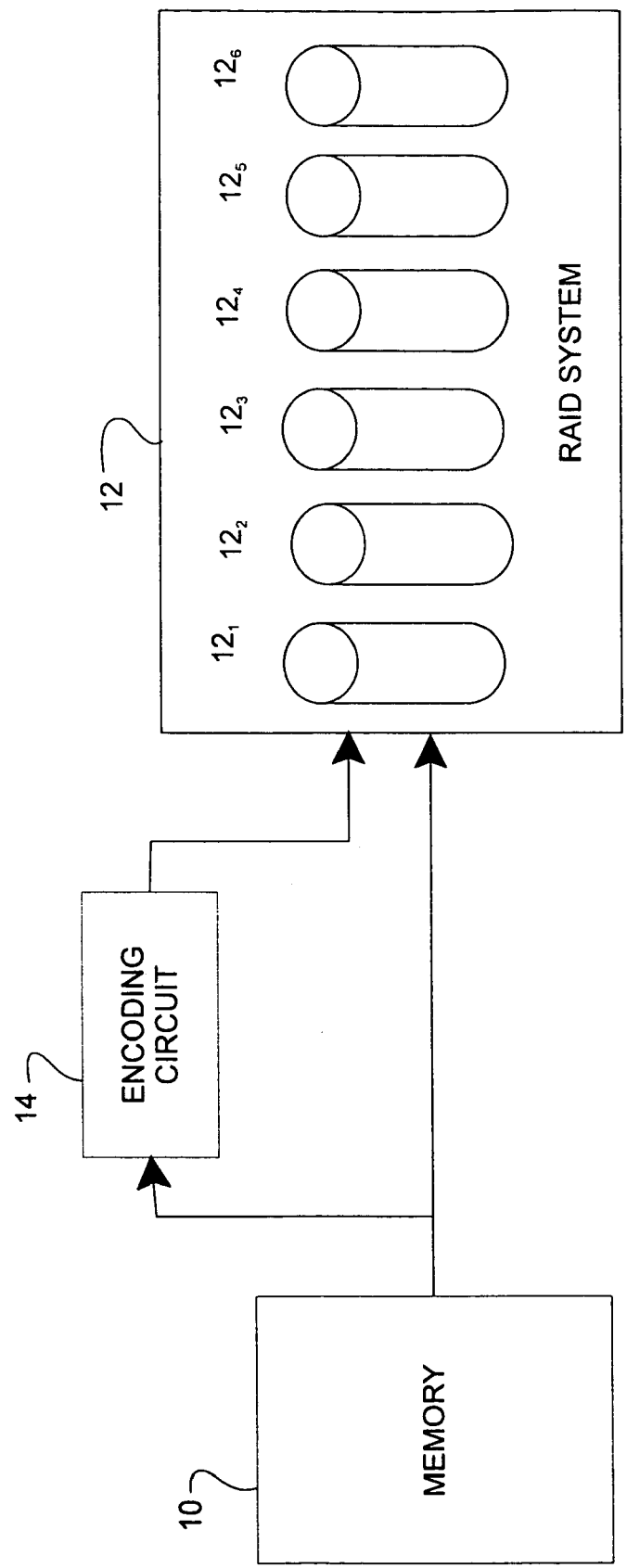
FIG. 1 is a block diagram illustrating an encoding system for a RAID system.

Referring now to the drawings, and more particularly to FIG. 1, there is shown a block diagram illustrating an encoding system for a RAID system in which the present invention may be implemented. Data stored in main memory 10, such as volatile random access memory (RAM), of a computer system is read to an auxiliary storage RAID system 12 for non-volatile storage. At the same time, the data is read to an encoder 14 for encoding the erasure correcting codes. The encoder can be implemented by suitable code in a microprocessor of the computer system. These erasure correcting codes are also stored in the RAID system 12. In the example illustrated, the RAID array comprises three data disks, $12_1$ to $12_3$, across which the data is striped, and three disks $12_4$ to $12_6$, which store the checking part of the erasure correcting code.

Figure 2:
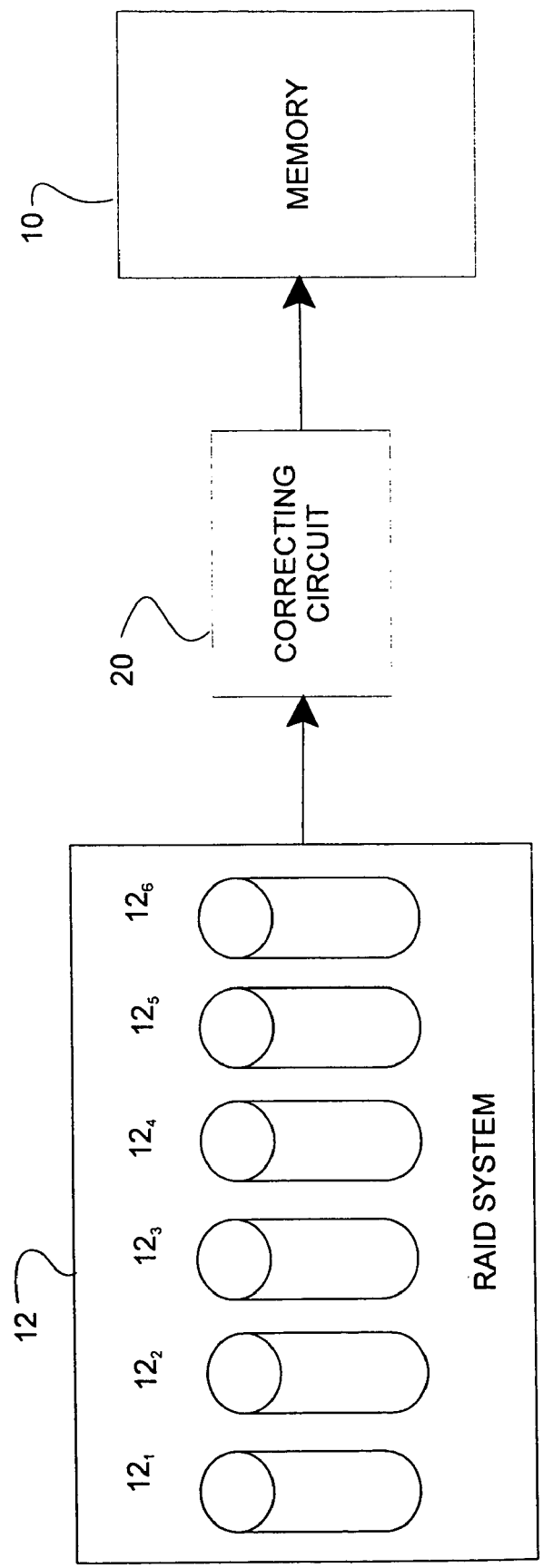
FIG. 2 is a block diagram illustrating a data reconstructing system for reading data from the RAID system.

FIG. 2 is a block diagram illustrating an example of reconstructing data from the RAID system 12 for the case of two failed disks, disks $12_2$ and $12_5$, for example. The data from the four non-failed disks, disks $12_1$, $12_3$, $12_4$ and $12_6$, are read out to a correcting circuit 20 for reconstructing the data. This circuit can be implemented by suitable code in the microprocessor of the computer system. The reconstructed data output from the circuit 20 is stored in memory 10.

We will start by describing a particular code which is constructed by the method according to the invention—a code which is of interest in its own right—and then describe the general methodology. This code is based on a code of six symbols, $x_0$, $x_1$, $x_2$, $x_3$, $x_4$, and $x_5$, each of which is an element of GF(4), the Galois Field of four elements (see James S. Plank, "A Tutorial on Reed-Solomon Coding for Fault-Tolerance in RAID-like Systems", supra), and where $x_0$, $x_1$ and $x_2$ are the information symbols and $X_3$, $x_4$ and $x_5$ are the check symbols. The check symbols are defined by:

$$\begin{bmatrix} x_3 \\ x_4 \\ x_5 \end{bmatrix} = \begin{bmatrix} 1 & 1 & 1 \\ 1 & a & a^2 \\ 1 & a^2 & a \end{bmatrix} \begin{bmatrix} x_0 \\ x_1 \\ x_2 \end{bmatrix}, \text{ that is } \underline{X}_C = A\underline{X}_1,$$

where $\alpha$ is an element of GF(4) which satisfies the equation $1+\alpha+\alpha^2=0$.

This code has distance four; that is, it is possible to correct any three (or fewer) erasure errors. For example, if $x_0$, $X_3$ and $x_5$ have failed, then:

$$x_0 = x_4 + ax_1 + a^2 x_2, \text{ that is, } x_0 = \begin{bmatrix} 1 & a & a^2 \end{bmatrix} \begin{bmatrix} x_4 \\ x_1 \\ x_2 \end{bmatrix} = BX_{4,1,2}.$$

We now replace, in $\underline{X}_C$ and in $\underline{X}_1$, each $x_i$ ($i=0, 1, 2, 3, 4, 5$) by the pair of words $w_i=(w_{i,0}, w_{i,1})^t$, and in A we replace 1 by the 2×2 matrix $$\begin{bmatrix} 1 & 0 \\ 0 & 1 \end{bmatrix},$$

$\alpha$ by the 2×2 matrix $$\begin{bmatrix} 0 & 1 \\ 1 & 1 \end{bmatrix},$$

and $\alpha^2$ by the 2×2 matrix $$\begin{bmatrix} 1 & 1 \\ 1 & 0 \end{bmatrix},$$

and $\underline{X}_C = A\underline{X}_1$ becomes $$\begin{bmatrix} w_{3,0} \\ w_{3,1} \\ w_{4,0} \\ w_{4,1} \\ w_{5,0} \\ w_{5,1} \end{bmatrix} = \begin{bmatrix} 1 & 0 & 1 & 0 & 1 & 0 \\ 0 & 1 & 0 & 1 & 0 & 1 \\ 1 & 0 & 0 & 1 & 1 & 1 \\ 0 & 1 & 1 & 1 & 1 & 0 \\ 1 & 0 & 1 & 1 & 0 & 1 \\ 0 & 1 & 1 & 0 & 1 & 1 \end{bmatrix} \begin{bmatrix} w_{0,0} \\ w_{0,1} \\ w_{1,0} \\ w_{1,1} \\ w_{2,0} \\ w_{2,1} \end{bmatrix}, \text{ that is } \underline{W}_C = r(A)\underline{W}_1.$$

This code, which we call the (3, 3) code, has the property that even if all the information in any three of the words $w_i$ is erased, the data can be recovered.

There are many ways to compute $\underline{W}_C=r(A)\underline{W}_1$. One of them (the preferred one, since it uses the smallest number of XORs) is as follows (note here the symbol "$\oplus$" stands for XOR of two words):

$v_1=w_{1,0}\oplus w_{2,0}$
$v_2=w_{1,1}\oplus w_{2,1}$
$v_3=w_{2,0}\oplus w_{0,0}$
$v_4=W_{2,1}\oplus w_{0,1}$
$w_{3,0}=w_{0,0}\oplus v_1$
$w_{3,1}=w_{0,1}\oplus V_2$
$w_{5,1}=v_4\oplus v_1$
$w_{4,0}=v_3\oplus v_2$
$w_{4,1}=v_2\oplus w_{5,1}$
$w_{5,0}=v_1\oplus w_{4,0}$ To recover errors, we use the same procedure. For example, if we know that $w_0$, $w_1$ and $w_5$ have failed and we want to recover $w_0$, we substitute the same 2×2 matrices for the entries of B and $w_4$, $w_1$, $w_2$ for $x_4$, $x_1$, $x_2$ in $\underline{X}_{4,1,2}$ and $x_0=B\underline{X}_{4,1,2}$ becomes:

$$\begin{bmatrix} w_{0,0} \\ w_{0,1} \end{bmatrix} = \begin{bmatrix} 1 & 0 & 0 & 1 & 1 & 1 \\ 0 & 1 & 1 & 1 & 1 & 0 \end{bmatrix} \begin{bmatrix} w_{4,0} \\ w_{4,1} \\ w_{1,0} \\ w_{1,1} \\ w_{1,1} \\ w_{2,0} \\ w_{2,1} \end{bmatrix},$$

and $w_0$ can be recovered by performing five XORs.

In general, when we have a linear code C over $GF(2^n)$, the Galois Field of $2^n$ elements for n greater than one, which can correct up to e erasure errors, we convert it to a code C which can correct up to e erasures in words, and whose encoding and correcting can be performed by XORing words as follows:

1. The encoding for code C is of the form $\underline{X}_C = A\underline{X}_1$, and each of the corrections is also of the form $x_i = B_i\underline{X}$, where A and the $B_i$s are matrices over $GF(2^n)$.
2. Choose a representation, r, of $GF(2^n)$. The representation assigns an n×n matrix, $r(\alpha)$, for every element a in $GF(2^n)$, whose elements are in $GF(2)$; i.e., are "0" or "1".
3. To obtain the encoder of code C, substitute the matrix $r(\alpha)$ for every element a of A, to obtain the matrix $r(A)$, and substitute $w_i$ for $x_i$ in $\underline{X}_1$ and in $\underline{X}_C$, where $w_i = (w_{i,0}, w_{i,1}, \ldots, w_{i,n-1})^t$ to obtain $\underline{W}_1$ and $\underline{W}_C$. The encoder of code C is $\underline{W}_C = r(A)\underline{W}_1$.
4. Similarly, by substituting $r(\alpha)$ for every element $\alpha$ of $B_i$ to obtain $r(B_i)$, and substituting $w_j$ for every element $x_j$ of $\underline{X}$ to obtain $\underline{W}$, we can recover $x_i$ by using $w_i = r(B_i)\underline{W}$.

Since the entries of matrix A and of the $B_i$s are elements of $GF(2)$, i.e., "0" or "1", it is clear that both the encoding and recovery can be done by XORs of the words $w_{i,j}$ It is also clear that code C, by its construction, can recover the loss of up to e of the $w_i$s.

Figure 3:
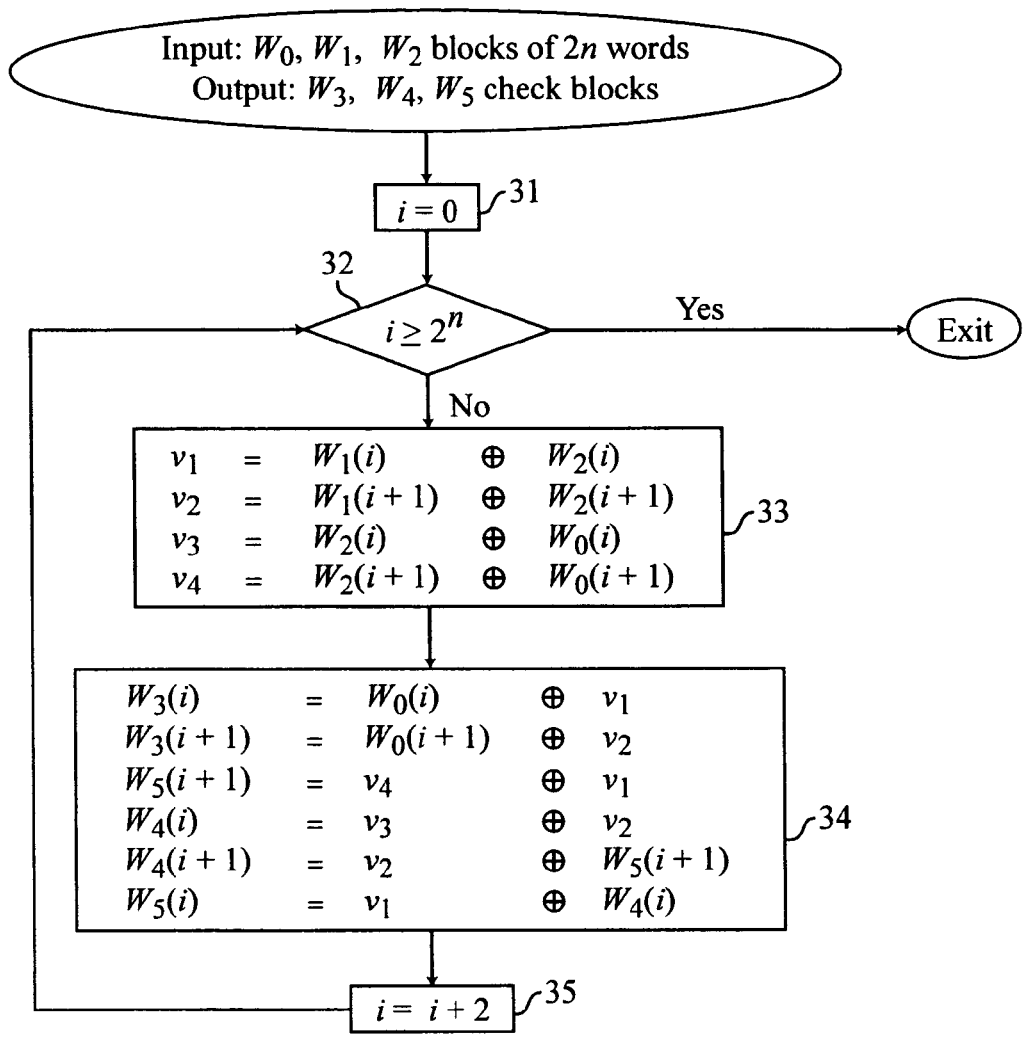
FIG. 3 is a flow diagram illustrating the logic implemented in the encoder of the system shown in FIG. 1.

FIG. 3 is a flow diagram illustrating the logic of the implementation of the encoder 14 in FIG. 1. The input to the process is $W_0$, $W_1$, $W_2$ blocks of 2n words, and the output is $W_3$, $W_4$, $W_5$ check blocks. The process begins by initializing the index, i, to zero in function block 31. A processing loop is entered at decision block 32 where a determination is made as to whether i is greater than or equal to $2^n$. If so, the process exits; otherwise, the following exclusive OR operations are performed in function block 33:

$v_1 = W_1(i) \oplus W_2(i)$
$v_2 = W_1(i+1) \oplus W_2(i+1)$
$v_3 = W_2(i) \oplus W_0(i)$
$v_4 = W_2(i+1) \oplus W_0(i+1')$ This is followed by performing the following exclusive OR operations in function block 34:

$W_3(i) = W_0(i) \oplus v_1$
$W_3(i+1) = W_0(i+1) \oplus v_2$
$W_5(i+1) = v_{4 \oplus v1}$
$W_4(i) = v_{3 \oplus v2}$
$W_4(i+1) = v_{2 \oplus W5}(i+1)$
$W_5(i) = v_{1 \oplus W4}(i)$ The index, i, is incremented by two in function block 35, and the process loops back to decision block 32. This processing loop continues until i is determined to be greater than or equal to $2^n$.

Figure 4:
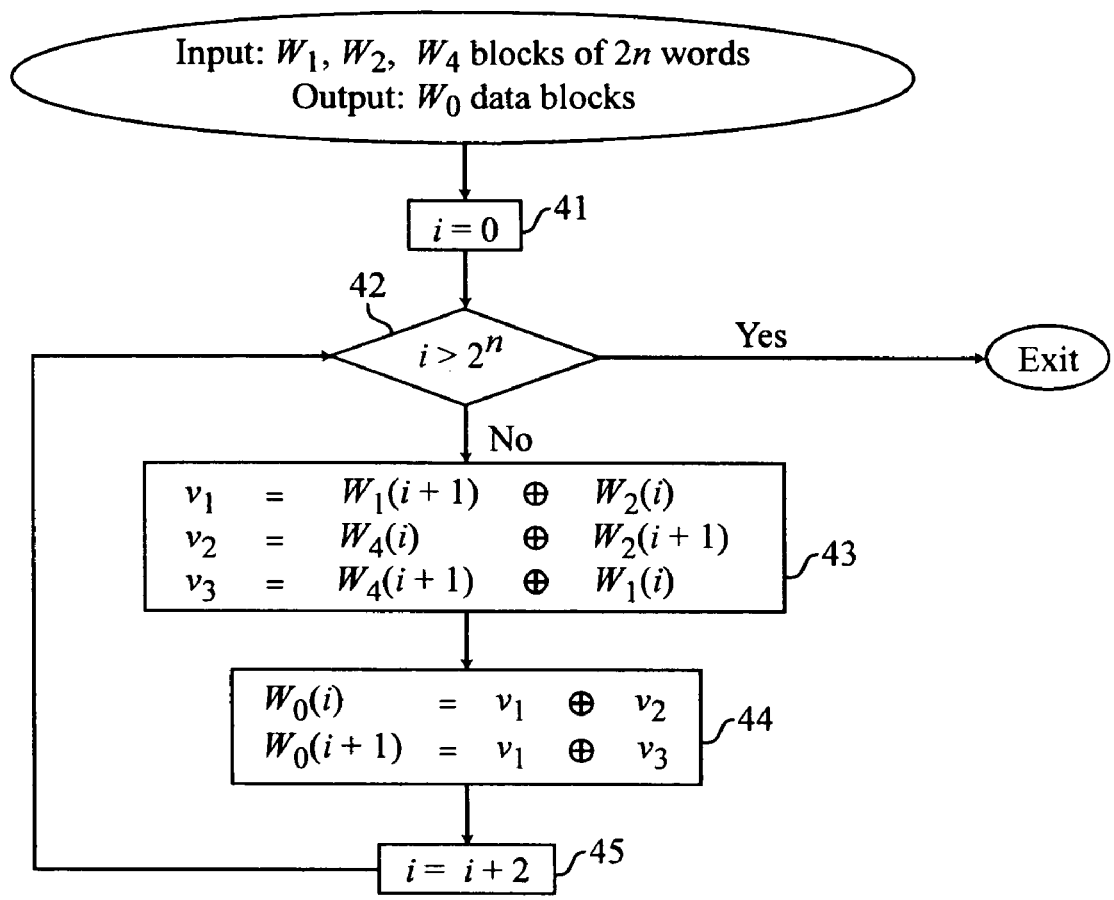
FIG. 4 is a flow diagram illustrating the logic implemented in the decoder of the system shown in FIG. 2.

FIG. 4 is a flow diagram illustrating the logic of the implementation of the decoder 20 in FIG. 2 where disks $12_2$ and $12_5$ have failed, for example. Corrections of other failure patterns of at most three failed disks can be performed in a similar manner for this example. The input to the process is $W_1$, $W_2$, $W_4$ blocks of $2^n$ words, and the output is $W_0$ data block. The process begins by initializing the index, i, to 0 in function block 41. A processing loop is entered at decision block 42 where a determination is made as to whether i is greater than or equal to $2^n$. If so, the process exits; otherwise, the following exclusive OR operations are performed in function block 43:

$v_1 = W1(i+1) \oplus W_2(i)$
$v_2 = W4(i) \oplus W_2(i+1)$
$v_3 = W4(i+1) \oplus W_1(i)$ This is followed by performing the following exclusive OR operations in function block 44:

$W_0(i) = v_{1 \oplus v2}$
$W_0(i+1) = v_{1 \oplus v3}$

The index, i, is incremented by two in function block 45, and the process loops back to decision block 42. This processing loop continues until i is determined to be greater than or equal to $2^n$.

The method according to the invention has been implemented in software and compared with other known solutions. The software was written in the C programming language, and the performance measured on an IBM ThinkPad® laptop computer with a 1.7 GHz Intel Pentium® 4 (P4) processor. The P4 processor has a two level cache and pipelined architecture. We therefore examined the performance of the codes as a function of the buffer size for each hard disk drive (HDD). Small buffer sizes would show the performance of the 512 KB L2 cache, while larger sizes would show the performance of the underlying memory system. The following codes were tested: (1) a generic Reed-Solomon (RS) code, implemented using a Vandermonde matrix and a lookup table to perform multiplication over GF(256) and optimized for the (3+3) configuration; (2) the EVENODD (3+3) code; and (3) the code according to the present invention and described above.

The results clearly showed the advantages of the XOR codes according to the invention over conventional RS codes. Further, the higher efficiency of the present invention was apparent when the performance was limited by the processor (small buffer sizes). The code according to the invention used six loads, ten XORs and six stores to process six data words. Thus, there were two memory operations and 10/6=1.6 XORs per word. Note that the word length can be arbitrary. In contrast, the EVENODD (3+3) code used 28 loads, 30 XORs and six stores to process 12 data words. Thus, there were 30/12=2.5 XORs per word. Again, the word length can be arbitrary.

While the invention has been described in terms of a single preferred embodiment, those skilled in the art will recognize that the invention can be practiced with modification within the spirit and scope of the appended claims.

The invention claimed is:

1. A computer implemented method for encoding and correcting erasure errors comprising the steps of:
   transforming encoding and decoding matrices of $GF(2^n)$, the Galois Field of $2^n$ elements for n greater than one, and wherein a converted code is a (3, 3) code of distance four; and
   encoding data and correcting erasure errors using only exclusive OR operations on complete data words for error correcting codes with four or more check symbols which can correct as many errors as there are check symbols.

2. A computer implemented method for encoding data and correcting erasure errors comprising the steps of:
   converting a code over a finite field of characteristic two which can correct up to e erasure errors into a code which can correct up to e erasure errors in words;
   encoding data using the converted code;
   reading the encoded data and correcting up to e erasure errors in words, wherein the converted code is a (3, 3) code, wherein even if all the information in any three of the words $w_1$ is erased, the data can be recovered.

3. A computer implemented method for encoding and correcting erasure errors comprising the steps of:
   transforming encoding and decoding matrices of $GF(2^n)$, the Galois Field of $2^n$ elements for n greater than one, and
   encoding data and correcting erasure errors using only exclusive OR operations on complete data words.

4. The computer implemented encoding and correcting method recited in claim 3, wherein a (3, 3) code of distance four is used.

5. A computer implemented method for encoding and correcting four or more erasure errors in data whose locations are known, comprising the steps of:
- converting a code over a finite field of characteristic two into a code whose encoding and correcting algorithms involve only exclusive OR (XOR) operations of complete data words;
- reading data from main volatile memory and encoding the data using only XOR operations to generate a correcting code;
- storing data and correcting code in an auxiliary array of non-volatile storage devices;
- reading the data from the auxiliary array of non-volatile storage devices; and
- reconstructing erasure errors in the data read from the auxiliary array of non-volatile storage devices using only XOR operations to generate reconstructed data.

6. The computer implemented method recited in claim 5, wherein the code whose encoding and correcting algorithms involve only XOR operations of words is a (3, 3) code of distance four.

7. The computer implemented method recited in claim 6, wherein the code whose encoding and correcting algorithms involve only XOR operations of words is based on a code of six symbols, $x_0$, $x_1$, $x_2$, $x_3$, $x_4$, and $x_5$, each of which is an element of GF(4), the Galois Field of four elements, and where $x_0$, $x_1$ and $x_2$ are information symbols and $x_3$, $x_4$ and x5 are check symbols, the check symbols being defined by:

$$\begin{bmatrix} x_3 \\ x_4 \\ x_5 \end{bmatrix} = \begin{bmatrix} 1 & 1 & 1 \\ 1 & a & a^2 \\ 1 & a^2 & a \end{bmatrix} \begin{bmatrix} x_0 \\ x_1 \\ x_2 \end{bmatrix}, \text{ that is } \underline{X}_C = A\underline{X}_1,$$

where $\alpha$ is an element of GF(4) which satisfies the equation $1+\alpha+\alpha^2=0$.

8. The computer implemented method recited in claim 7, wherein by substitution $\underline{X}_C = A\underline{X}_1$ becomes $\underline{W}_C = r(A) \underline{W}_1$, where $\underline{W}_C$ is a correction word and $\underline{W}_1$ is a data word to be reconstructed.

9. The computer implemented method recited in claim 8, wherein, given a linear code over $GF(2^n)$, the Galois Field of $2^n$ elements, which can correct up to e erasure errors, to a code which can correct up to e erasures in words, and whose encoding and correcting can be performed by XOR-ing words, the method comprises the steps of:
- encoding the linear code in the form $\underline{X}_C = A\underline{X}_1$, and each of the corrections is also of the form $x_i = B_i\underline{X}$, where A and the $B_i$s are matrices over $GF(2^n)$;
- choosing a representation, r, of $GF(2^n)$, which representation assigns an n×n matrix, $r(\alpha)$, for every element a in $GF(2^n)$, whose elements are in GF(2), i.e., are "0" or "1";
- obtaining the decoder of converted code by substituting the matrix $r(\alpha)$ for every element $\alpha$ of A, to obtain the matrix A, and substituting $w_i$ for $x_i$ in $\underline{X}_1$ and in $\underline{X}_C$, where $w_i = (w_{i,0}, w_{i,1}, \ldots, W_{i,n-1})^t$ to obtain $\underline{W}_1$ and $\underline{W}_C$, the encoder of the code being $\underline{W}_C = r(A)\underline{W}_1$; and
- substituting $r(\alpha)$ for every element $\alpha$ of $B_i$ to obtain $r(B_i)$ and substituting $w_j$ for every element $x_j$ of $\underline{X}$ to obtain $\underline{W}$ to recover $x_i$ by using $w_i = r(B_i)\underline{W}$.

10. A computer system for correcting four or more erasure errors whose locations are known, comprising:
- a main volatile memory and an auxiliary array of non-volatile storage devices connected for transferring data therebetween;
- an encoding means for converting a code over a finite field of characteristic two into a code whose encoding and correcting algorithms involve only exclusive OR (XOR) operations of complete data words, data read from said main volatile memory being encoded by said encoding means using only XOR operations to generate a correcting code and stored with the correcting code in said auxiliary array of non-volatile storage devices; and
- data reconstructing means which, when data is read from the auxiliary array of non-volatile storage devices, reconstructs erasure errors in the data read from the auxiliary array of non-volatile storage devices using only XOR operations to generate reconstructed data.

11. The computer system recited in claim 10, wherein the code whose encoding and correcting algorithms involve only XOR operations of words is a (3, 3) code of distance four.

12. A computer implemented method for encoding and correcting erasure errors comprising the steps of:
- encoding data transferred from a memory to a storage device using only XOR operations on complete data words; and
- reconstructing data stored in said storage device using only XOR operations on complete data words.

* * * * *